United States Patent
Braun et al.

(10) Patent No.: US 7,667,504 B2
(45) Date of Patent: Feb. 23, 2010

(54) SIGNAL DELAY ELEMENT, METHOD AND INTEGRATED CIRCUIT DEVICE FOR FREQUENCY ADJUSTMENT OF ELECTRONIC SIGNALS

(75) Inventors: Florian Braun, Stuttgart (DE); Dedric Lichtenau, Stuttgart (DE); Thomas Pflueger, Leinfelden (DE); Ulrich Weiss, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 12/045,894

(22) Filed: Mar. 11, 2008

(65) Prior Publication Data
US 2009/0021288 A1  Jan. 22, 2009

(30) Foreign Application Priority Data
May 22, 2007  (EP)  ................................. 07108644

(51) Int. Cl.
*H03B 19/00*  (2006.01)

(52) U.S. Cl. ........................ 327/113; 327/115; 327/149; 327/158

(58) Field of Classification Search .......... 327/113–115, 327/117–118, 261, 263, 265, 149, 151, 158, 327/161; 377/47–48
See application file for complete search history.

(56) References Cited

U.S. PATENT DOCUMENTS

| 7,098,708 B2 * | 8/2006 | Fahim | .................. 327/155 |
| 7,196,558 B2 * | 3/2007 | Miller, Jr. | .................. 327/115 |

* cited by examiner

*Primary Examiner*—An T Luu
(74) *Attorney, Agent, or Firm*—John E. Campbell

(57) ABSTRACT

The invention relates to frequency adjustment of electronic signals. The method comprises the steps of providing an output signal of a frequency generator with a first frequency as input signal for a signal delay element providing an edge of said input signal of said signal delay element; delaying said input signal by adding a delay to each cycle of said input signal until the delayed output signal of the signal delay element is aligned to an edge of said input signal.

20 Claims, 2 Drawing Sheets

SIGNAL DELAY ELEMENT, METHOD AND INTEGRATED CIRCUIT DEVICE FOR FREQUENCY ADJUSTMENT OF ELECTRONIC SIGNALS

FIELD OF THE INVENTION

The invention relates to a method for frequency adjustment of electronic signals, a signal delay element and an integrated circuit device.

BACKGROUND

The problem in the new semiconductor technologies is that the DC power (leakage of the transistors) is growing because the devices get smaller and the AC power is growing because of higher frequencies and their respective voltage.

A number of commercial computer processors (CPU: central processing unit) nowadays offer dynamic voltage and frequency scaling (DVS) as a mechanism to reduce or limit power consumption. Examples include Enhanced SpeedStep® technology in Intel processors, PowerNow!™ in AMD processors, and PowerTune® in IBM PowerPC® 970.

There is significant prior art that proposes schemes that use CPU utilization to determine when to use DVS without reducing or reducing excessively the computing system's performance. Low CPU utilization at the lowest frequency is considered as indicative of a low performance requirement, which, in turn, lets the system use a lower operating point, thereby saving power. High CPU utilization at a lower operating point would be considered indicative of higher demand for processor cycles and consequently interpreted as a situation when a higher operating point could improve performance.

Other schemes for determining the right operating point to use for particular workloads and workload mixes use off-line characterization of workload behaviour or a general expectation from the type of workload. For example, running compute-intensive applications would cause the CPU to use a higher operating point while running user-interaction dominated applications would cause the CPU to use a lower operating point.

In all proposed and implemented approaches, DVS is exploited primarily for power savings with user-specified, application-specified or system-inferred measures to estimate the CPU requirements.

Therefore, to manage the power dissipation of microprocessors effectively, it is very important to dynamically change the frequency which allows either the voltage to follow the frequency change as fast as possible or to stabilize the voltage on the chip by only changing the frequency.

Possible solutions known for dynamically changing the frequency are slewing a reference frequency which feds a digital phase locked loop device (PLL) and by this way changing the frequency of the devices attached to it. The speed of changing the frequency is limited by the bandwidth of the PLL. Typically, only changes of frequencies are allowed in the millisecond (ms) region, whereas for the DVS power management method changes in the sub nanosecond (ns) region are necessary.

SUMMARY OF THE INVENTION

It is an objective of the invention to provide a method for input frequency adjustment of electronic signals on a chip in a very fast and smooth way, for example in order to manage power dissipation of electronic devices.

Another objective of the invention is to provide a signal delay element and an integrated circuit device for performing such a method.

These objectives are achieved by the features of the independent claims. The other claims and the specification disclose advantageous embodiments of the invention.

A method for frequency adjustment of electronic signals is proposed comprising the steps of providing an output signal of a frequency generator with a first frequency as input signal for a signal delay element;

providing an edge of said input signal of said signal delay element;

delaying said input signal by adding a delay to each cycle of said input signal until the delayed output signal of the signal delay element is aligned to an edge of said input signal.

The main advantage of the invention is to be able to change the frequency in a smooth and fast way to prevent dI/dt slew rate problems (dI/dt=differential change of current in time). The frequency transformation can occur immediately at any cycle of the input signal. Additionally, an electronic device, e.g. a processor, where the preferred method is implemented, is relatively stable in varying environment conditions.

There is also a wide range of frequency change capabilities (e.g. 5% to 50%) which could be achieved with the proposed method without changing the reference clock to the frequency generator.

Further, a signal delay element is proposed, comprising:

a programmable delay line with a signal input for receiving an input signal and a signal output for outputting an output signal;

a phase compare and reset logic connected to the signal input and receiving an output signal from said programmable delay line as well as from a delay look ahead block, where said delay look ahead block is also connected to the signal output of said programmable delay line;

an adder block, wherein a delay step size definition block is connected to an input of the adder block;

a counter block, wherein said counter block is receiving input from said adder block and from said phase compare and reset logic;

a decoder block, wherein said adder block is connected to an input of said counter block, said counter block is connected to an input of said decoder block and said decoder block is connected to the programmable delay line.

According to another aspect of the invention an integrated circuit device is proposed comprising a signal delay element coupled to an output of a frequency generator for transforming a first frequency of an output signal of said frequency generator to a second frequency below said first frequency by aligning pulse edges of an output signal of said signal delay element to pulse edges of said output signal of said frequency generator.

The invention is particularly favorable for protecting processors or power management. An electronic device, e.g. a processor, where the preferred method and/or delay element is implemented is relatively stable in varying environment conditions.

Implemented in electronic circuits it also provides flexibility of integration on the chip because of its small size being possible to be implemented multiple times.

BRIEF DESCRIPTION OF THE DRAWINGS

The present invention together with the above-mentioned and other objects and advantages may best be understood from the following detailed description of the embodiments, but not restricted to the embodiments, wherein is shown in.

DETAILED DESCRIPTION OF THE INVENTION

According to the invention, a method for input frequency adjustment of electronic signals is proposed comprising the steps of providing an output signal of a frequency generator with a first frequency as input signal for a signal delay element; providing an edge of said input signal of said signal delay element; delaying said input signal by adding a delay to each cycle of said input signal until the delayed output signal of the signal delay element is aligned to an edge of said input signal.

Figure 1:
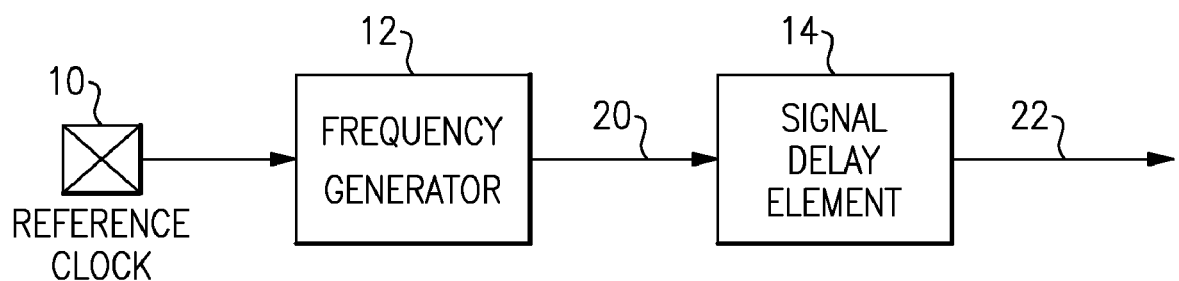
FIG. 1 depicts a general layout for frequency generation and transformation of electronic signals with a signal delay element.

The general layout for a frequency generation and transformation circuit of electronic signals according to the method of the preferred embodiment is shown in FIG. 1. An electronic signal generated by a reference clock 10 is fed to a frequency generator 12 which is preferably represented by a PLL circuit. The output of said frequency generator serves as input signal 20 for a signal delay element 14. This signal delay element is acting according to the preferred method of the invention, further on also called successive delay add (SDA), and behind the PLL circuit modifying said frequency of said input signal 20. The output signal 22 with the second transformed frequency supplies the latches and arrays of further units of an electronic circuit.

Figure 2:
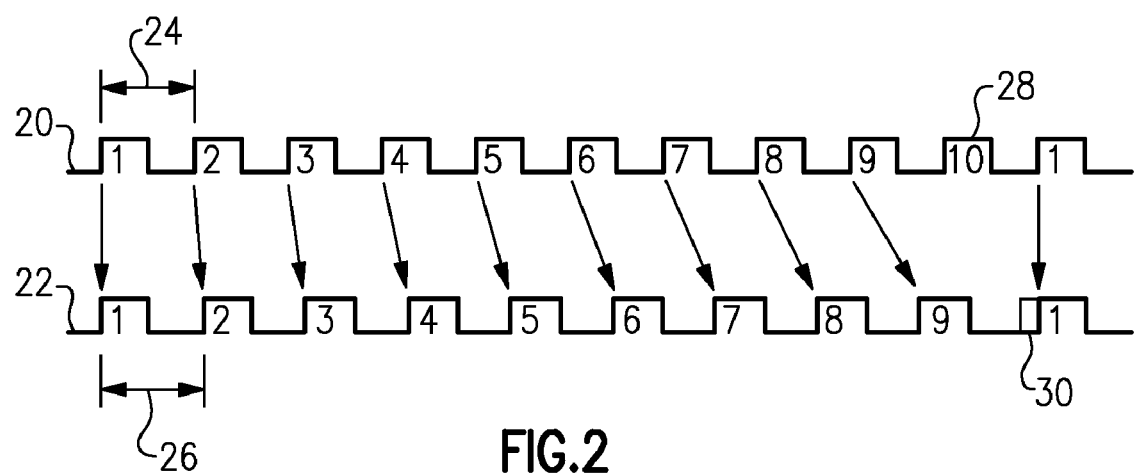
FIG. 2 depicts a description of the basic functionality of frequency transformation according to a successive delay add (SDA) method in accordance with the present invention.

The basic functionality of the frequency transformation method proposed in the preferred embodiment according to the SDA procedure is described in FIG. 2. The clock edges of the input signal 20 of said signal delay element 14 are delayed in such a way that e.g. as shown in FIG. 2 the PLL has generated 10 clock pulses of a fixed cycle period 24 and said signal delay element 14 has only generated 9 pulses of a longer cycle period 26. This is a frequency reduction seen by the clock mesh following said signal delay element 14 behind on the electronic circuit.

This frequency change can be triggered at any cycle of the clock mesh and it is also possible to stop at the current frequency or change the frequency to slower or faster values at once. Stepping through such a frequency scheme it is possible to change the frequency as fast as possible omitting a dI/dt slew rate problem in case of large fast frequency reduction. Also, because of the fast response time, it would be possible to control voltage droops with such an aperture.

Preferably, the rising edge of said input signal 20 is used for edge alignment of the output 22 and input signals 20. It is also possible to use the falling edge for edge alignment of the output 22 and input signals 20. In order to get stable signals it is preferable that equal delays are added to each cycle of the input signal 20.

It is a further characterization of the method that in each cycle a delay is added to the rising and falling edge.

As is demonstrated in FIG. 2 the last cycle 9 of the output signal 22 is characterized by a longer cycle period 30 in order to catch up with the next input signal cycle 20 fed by the frequency generator 12.

Figure 3:
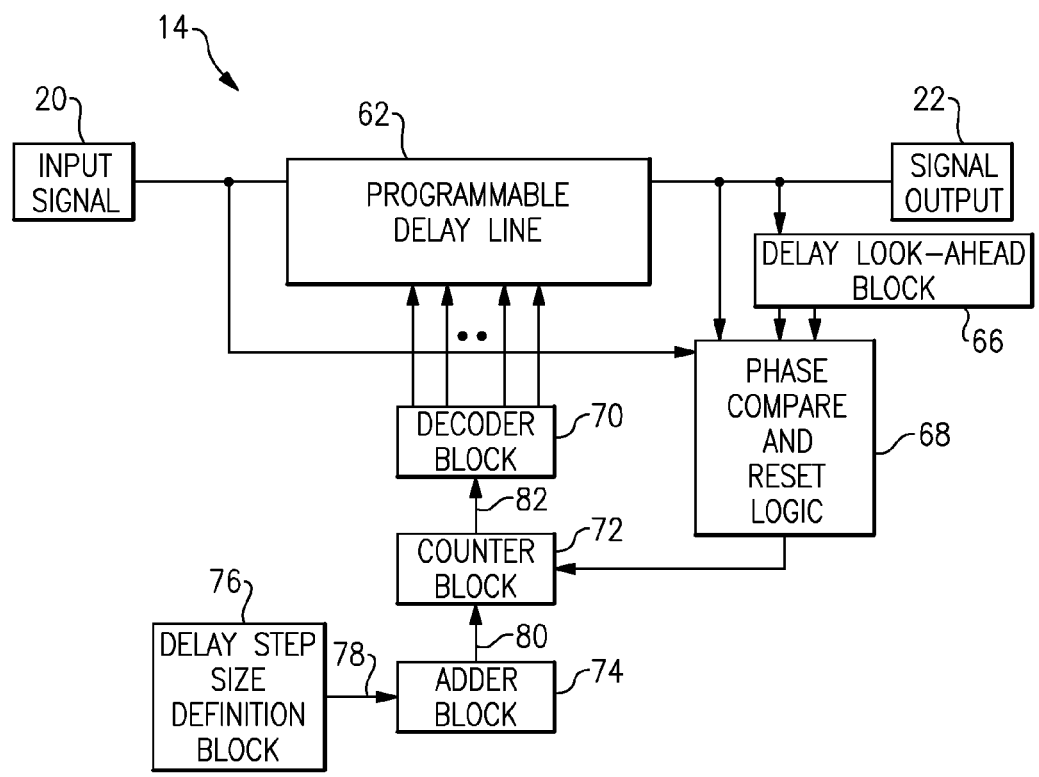
FIG. 3 depicts main components of the signal delay element for implementation of the SDA method on a chip.

FIG. 3 shows the main components of said signal delay element 14. It comprises a programmable delay line 62 with a signal input 20 for receiving an input signal and a signal output 22 for outputting an output signal. A phase compare and reset logic 68 is connected to the signal input 20 and receives an output signal from said programmable delay line 62 as well as from a delay look ahead block 66. Said delay look-ahead block 66 is also connected to the signal output of said programmable delay line 62. An adder block 74, which gets an input 78 from a delay step size definition block 76 is feeding input to a counter block 72. Said counter block 72 is receiving input also from said phase compare and reset logic 68. Said counter block 72 is connected to an input 82 of a decoder block 70 which gives main input to the programmable delay line 62.

The adder block 74 is also connected directly to the input of the decoder block 70 bypassing the counter block 72 thus serving feedback to the adder block 74.

Preferably, the method according to the preferred embodiment is implemented in a signal delay element as described by the block diagram of FIG. 3.

With the implementation of FIG. 3 the signal delay element 14 is getting an output signal of a frequency generator 12 as input signal 20. By this way, an edge of said input signal 20 can be identified for delaying said input signal 20 by adding a delay to each cycle of said input signal until the delayed output signal 22 of the signal delay element 14 is aligned to an edge of said input signal 20.

The method of the preferred embodiment, which may be implemented in said signal delay element 14, consists in more detail of calculating the number of delay steps according to the actual requirements for transformation of the first frequency to the second frequency in a delay step size definition block 76. Then the amount of delay per step is calculated according to the actual requirements for transformation of the first frequency to the second frequency in a delay step size definition block 76. The step size of the delay is added with each half cycle of the input signal 78 in an adder block 74, while still counting the single delays added to the edges in a counter block 72. By this way the $1^{st}$ delay is added to the rising signal phase of the $1^{st}$ cycle, the $2^{nd}$ delay is added to the rising signal phase of the $2^{nd}$ cycle etc. and the $i^{th}$ delay is added to the rising signal phase of the $i^{th}$ cycle in an adder block 74 as well as the $(i+1)^{th}$ delay is added to the falling signal phase of the $(i+1)^{th}$ cycle in the same adder block 74, with i=1 to n and n is number of cycles.

In a further embodiment an integrated circuit device comprises such a signal delay element 14 coupled to an output of a frequency generator 12 for transforming a first frequency 24 of an output signal of said frequency generator 12 to a second frequency below said first frequency 26. Preferably, pulse edges of an output signal of said signal delay element 14 are aligned to pulse edges of said output signal of said frequency generator 12.

As shown in FIG. 3 the method is further characterized by providing a delay look ahead feature 66 for estimating in advance when the edges of the input 20 and output signals 22 will be aligned again.

Advantageously, an integrated circuit device according to one of the preferred embodiments are comprising at least one frequency generator 12 and at least one or more signal delay elements 14 for frequency adjustment.

Figure 4:
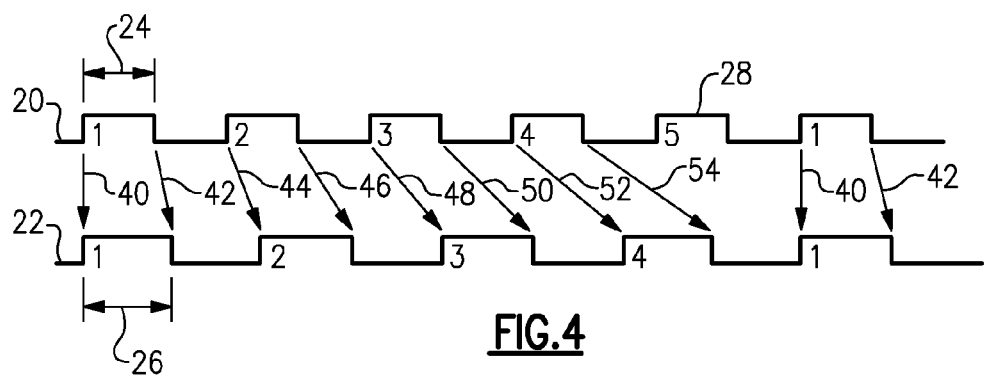
FIG. 4 depicts a description of the functionality of a 5-to-4 frequency reduction according to the SDA method.

An example for a 5-to-4 frequency reduction is demonstrated in FIG. 4 in order to explain the functionality of the proposed method in more detail. As shown in the diagram the rising edges of cycle 1 of the input signal 20 as well as of the output signal 22 are aligned. At that point zero delay 40 is inserted between input signal 20 and output signal 22. Starting with the falling edge of cycle 1 a delay 42 is added. For all following edges the same delays 44-54 are added until a rising edge of the output signal 22 is aligned with the rising edge of the input signal 20 again. Thus, the fifth cycle 28 of the input signal 20 is suppressed.

The main components of the signal delay element 14 are, as described in FIG. 3, a programmable delay line 62, a decode block 70, a counter block 72, an adder block 74 and a delay step definition block 76, and a delay look ahead block 66. The number of delay steps, as well as the amount of delay per step, depends on the actual requirements. If, e.g. for a cycle time of 300 ps a minimum increment of 10 ps is required, 60 steps with a delay of 5 ps each has to be chosen. The decode block 70 adopts the counter output to the delay line programming requirements. The counter block 72 runs 2 times the frequency of the input signal 20. For instance, for sixty steps a 6-bit binary counter is required. The adder block 74 and delay step definition block 76 define step size of delay that will be added with each half cycle, e.g. step sizes of 10 ps, 20 ps, 30 ps, . . . are possible. The delay look-ahead block 66 is allows to detect in advance when the rising edges of the input signal 20 and the output signal 22 will be aligned again.

The invention further offers the major advantage that because of the small size of the necessary electronic units a multitude of signal delay elements 14 may be assigned to one frequency generator 12.

Another major advantage of the method described in the preferred embodiment is that a transformation of the first frequency of the input signal 20 to the second frequency of the output signal 22 of said signal delay element 14 by adding delays to each cycle of the input signal can be applied with a transformation already being in progress.

What is claimed is:

1. A method for frequency adjustment of electronic signals in an integrated electronic circuit comprising the steps of
    providing an output signal of a frequency generator with a first frequency as input signal for a signal delay element;
    providing an edge of said input signal of said signal delay element; and
    delaying said input signal by adding a delay to each cycle of said input signal until the delayed output signal of the signal delay element is aligned to an edge of said input signal.

2. The method according to claim 1, wherein the rising edge is used for edge alignment of the output and input signal.

3. The method according to claim 1, wherein the falling edge is used for edge alignment of the output and input signal.

4. The method according to claim 1, wherein equal delays are added to each cycle of the input signal.

5. The method according to claim 4, wherein in each cycle a delay is added to any one of the rising edge or the falling edge.

6. The method according to claim 1, further comprising providing a delay look ahead feature for estimating in advance when the edges of the input and output signals will be aligned again.

7. The method according to claim 1, further comprising:
    calculating the number of delay steps according to the actual requirements for transformation of the first frequency to the second frequency;
    calculating the amount of delay per step according to the actual requirements for transformation of the first frequency to the second frequency;
    adding the step size of the delay with each half cycle of the input signal ;
    counting the single delays added to the edges;
    adding an i-th delay to the rising signal phase of the i-th cycle; and
    adding the (i+1)-th delay to the falling signal phase of the (i+1)-th cycle.

8. The method according to one of the claims 1, wherein a transformation of the first frequency of the input signal to the second frequency of the output signal of said signal delay element by adding delays to each cycle of the input signal is applied responsive to a transformation already being in progress.

9. A signal delay element in an electronic circuit, comprising
    a programmable delay line with a signal input for receiving an input signal and a signal output for outputting an output signal;
    a phase compare and reset logic connected to the signal input and receiving the output signal from said programmable delay line as well as a signal from a delay look ahead block, where said delay look ahead block is also connected to the signal output of said programmable delay line;
    an adder block, wherein a delay step size definition block is connected to an input of the adder block;
    a counter block, wherein said counter block is receiving input from said adder block and from said phase compare and reset logic; and
    a decoder block, wherein said adder block is connected to an input (80) of said counter block , said counter block is connected to an input (82) of said decoder block and said decoder block is connected to the programmable delay line.

10. The signal delay element according to claim 9, wherein the adder block is connected directly to the decoder block bypassing the counter block.

11. The signal delay element according claim 9, wherein the rising edge is used for edge alignment of the output and input signals.

12. The signal delay element according to claim 9, wherein the falling edge is used for edge alignment of the output and input signals.

13. The signal delay element according to claim 9, wherein equal delays are added to each cycle of the input signal.

14. The signal delay element according to claim 13, wherein in each cycle a delay is added any one of the rising edge or the falling edge.

15. The signal delay element according to claim 9, further comprising providing a delay look ahead feature for estimating in advance when the edges of the input and output signals will be aligned again.

16. The signal delay element according to claim 9, further comprising:
    calculating the number of delay steps according to the actual requirements for transformation of the first frequency to the second frequency;
    calculating the amount of delay per delay step according to the actual requirements for transformation of the first frequency to the second frequency;

adding the step size of the delay with each half cycle of the input signal;

counting the single delays added to the edges;

adding an i-th delay to the rising signal phase of the i-th cycle; and adding the (i+1)-th delay to the falling signal phase of the (i+1)-th cycle.

17. The signal delay element according to claim 9, wherein a transformation of the first frequency of the input signal to the second frequency of the output signal of said signal delay element by adding delays to each cycle of the input signal is applied responsive to a transformation already being in progress.

18. The signal delay element according to claim 16, further comprising:

providing an output signal of a frequency generator as input signal for a signal delay element;

providing an edge of said input signal of said signal delay element; and delaying said input signal by adding a delay to each cycle of said input signal until the delayed output signal of the signal delay element is aligned to an edge of said input signal.

19. The signal delay element according to claim 10, performing the steps of calculating the number of delay steps according to the actual requirements for transformation of the first frequency to the second frequency in a delay stepsize definition block;

calculating the amount of delay per step according to the actual requirements for transformation of the first frequency to the second frequency in a delay stepsize definition block;

adding the step size of the delay with each half cycle of the input signal (78) in an adder block;

counting the single delays added to the edges in a counter block;

adding the i-th delay to the rising signal phase of the i-th cycle in an adder block;

adding the (i+1)-th delay to the falling signal phase of the (i+1)-th cycle in an adder block.

20. The electronic circuit according claim 18, wherein a multitude of signal delay elements are assigned to one frequency generator.

* * * * *